United States Patent [19]

Muroyama et al.

[11] Patent Number: 5,260,232
[45] Date of Patent: Nov. 9, 1993

[54] REFRACTORY METAL PLUG FORMING METHOD

[75] Inventors: Masakazu Muroyama, Kanagawa; Junichi Sato, Tokyo, both of Japan

[73] Assignee: Sony Corporation, Tokyo, Japan

[21] Appl. No.: 863,713

[22] Filed: Apr. 3, 1992

[30] Foreign Application Priority Data

Apr. 5, 1991 [JP] Japan .................... 3-099771

[51] Int. Cl.⁵ ......................... H01L 21/441
[52] U.S. Cl. ..................... 437/187; 437/190; 437/192; 437/195
[58] Field of Search ........... 437/192, 187, 977, 195, 437/190, 173; 148/DIG. 138

[56] References Cited

U.S. PATENT DOCUMENTS

| | | | |
|---|---|---|---|
| 4,624,864 | 11/1986 | Hartmann | 437/192 |
| 4,800,179 | 1/1989 | Mukai | 437/173 X |
| 4,898,841 | 2/1990 | Ho | 437/192 X |
| 4,920,070 | 4/1990 | Mukai | 437/173 |
| 5,032,233 | 7/1991 | Yu et al. | 437/173 X |
| 5,093,279 | 3/1992 | Andreshak et al. | 437/173 |

Primary Examiner—John S. Maples
Attorney, Agent, or Firm—Hill, Steadman & Simpson

[57] ABSTRACT

A method for forming a plug in a connecting hole formed in an interlayer insulating film by filling a layer of a refractory metal in the connecting hole, in which the surface of a tungsten layer produced by a selective CVD method or a blanket CVD method (Blk-CVD method) with rough surface morphology is smoothed to produce the plug with high reliability. With the present method, the tungsten layer is formed, such as by the selective CVD method, as far as an intermediate depth of the connecting hole, the surface of the tungsten layer is smoothed, and an upper metallization layer is formed by a layer of another metal material. In this manner, bonding between the tungsten layer and the upper metallization is improved and contact resistance is diminished. Deposits of tungsten oxyfluoride or sulfur are utilized for smoothing. The deposition process of these deposits occur preferentially in minute recesses on the surface of the tungsten layer, while an etching reaction proceeds preferentially on minute lands on the surface, for achieving the smoothing. By such smoothing, generation of residues or transcription of the rough surface morphology of the tungsten layer to the underlying layer may be prevented to improve process reliability.

10 Claims, 3 Drawing Sheets

REFRACTORY METAL PLUG FORMING METHOD

BACKGROUND OF THE INVENTION

1. Field of the Invention

This invention relates to a method of forming a refractory metal plug for filling a fine connecting hole with a refractory metal layer during a production process for a semiconductor device.

2. Description of the Related Art

In VLSIs, as the circuit pattern becomes finer and the degree of integration is becoming higher, the opening diameter of connecting holes, such as contact holes or via-holes, formed in the interlayer insulating film, is becoming finer, while, in keeping pace therewith, the aspect ratio of the connecting hole is also increased. Among the most commonly employed interconnection materials for the semiconductor devices is an aluminum-based material, which is usually deposited by sputtering on a wafer. Bias sputtering also has recently been in use, by which a bias voltage is applied to the wafer during sputtering to achieve planarizing effects. However, if it is attempted to deposit an Al-based layer by bias sputtering when forming an interconnection between an upper metallization and a lower metallization by means of a connecting hole having a high aspect ratio, voids are produced within the connecting holes due to insufficient step coverage and these voids will lower the reliability of the metallization. For this reason, investigations in burying a layer of an electrically conductive material within a connecting hole for forming a plug are proceeding briskly.

However, the resistance can not be lowered satisfactorily if polysilicon etc. is used as an electrically conductive material. Thus the formation of a low resistance plug by refractory metal is attracting attention. The refractory metal now in popular use is tungsten (W).

A tungsten (W) plug may be formed by a blanket CVD method (Blk-CVD method) or a selective CVD method. In the Blk-CVD method, a uniform W layer is deposited within the connecting hole and on an interlayer insulating film, whereas, in the selective CVD method, a W layer is selectively grown in the connecting hole.

However, the following problems arise in these methods of forming the W plugs.

First, in the selective CVD method, the problem of failure in selectivity tends to be raised during the process. It is also difficult as a principle to uniformly fill connecting holes of different depths, such that excess growths known as nailheads are produced in narrow connecting holes where burial is completed prematurely. A process of coating the wafer once with a planarizing material, such as a resist, and subsequently etching back the wafer is required for removing the nailhead.

In the selective CVD method, because of rough surface morphology of the deposited W layer, microirregularities are produced on the surface to lower intimate bonding properties to the upper metallization to be formed during the subsequent process and to deteriorate reliability in the metallization.

On the other hand, in the Blk-CVD method, since the W layer is also deposited on the interlayer insulating film, an etching back operation becomes necessary to leave an W layer only within the connecting hole for forming a plug. Besides, with the Blk-CVD method, since columnar crystals of W are grown to a larger grain size, the W layer presents a rough surface morphology, as in the selective CVD method, such that residues tend to be produced during the etchback operation or the surface morphology tends to be transferred to the surface of the underlying barrier metal layer or the interlayer insulating film. The electrical resistance of the metallization may be increased due to these residues, or the intimate bonding to the upper metallization formed during the next step may be lowered because the surface morphology tends to be transferred to the underlying layer.

OBJECT AND SUMMARY OF THE INVENTION

In view of the above described status of the art, it is an object of the present invention to provide a method for forming a refractory metal plug by which the problem of the lowering of reliability in the metallization caused by roughness in the surface morphology may be overcome.

With the present method, the process of deposition of a deposition material and the process of etching of the layer of the refractory metal formed by the selective CVD method or the Blk-CVD method are caused to occur competitively on the surface of the layer of the refractory metal for smoothing the layer of the refractory metal. The following description is made of a W layer as a typical refractory metal layer.

Such concept of smoothing the surface of a layer on a wafer by competition of the deposition process and the etching process is reported in Extended Abstract of the 36th Spring Meeting (1989) of the Japan Society of Applied Physics and Related Societies, page 572, 1p-L-8. In this report, the surface of a polysilicon layer is smoothed using a $CF_4/O_2$ mixed gas. Silicon oxyfluoride yielded at this time has a lower vapor pressure on surfaces of a negative curvature, such as minute recesses, while having a high vapor pressure on surfaces of a positive curvature, such as minute lands. The result is that silicon oxyfluoride is deposited to an increased thickness in the recesses to inhibit etching of the polysilicon layer by fluorine radicals F*, whereas etching proceeds preferentially on the lands, thus smoothing the surface of the polysilicon layer.

This information has been the starting point of the present invention, which now enables smoothing of the surface of the W surface. The following three methods, which differ from one another as to the timing of the smoothing, are proposed by the present invention: i) a method of forming a W layer to a mid depth of the connecting hole by the selective CVD method, after which the surface of the Layer is smoothed and an upper metallization is formed by another metal layer; ii) a method of forming a Blk-W layer on the entire wafer surface by the Blk-CVD method, after which the surface of the Blk-CVD is smoothed and subsequently etched back; and iii) a method of forming a W layer to a mid depth of the connecting hole by the selective CVD method, after which the surface of the W layer is smoothed and a Blk-W layer is allowed to grow by the Blk-CVD method.

With the above method ii), the Blk-W layer is etched back to directly form the plug, whereas, with the methods (i) and (iii), it is the other subsequently formed metal layer or the Blk-W layer that is exposed as an upper plug surface. However, since the surface of the initially formed thin W layer is smoothed, there is no fear of worsening of the surface morphology of the other metal layer or the Blk-W layer formed on the smoothed W layer. Besides, since the W layer is deposited by the selective CVD method only as far as the mid depth of the connecting hole, there is no necessity of removing the nailheads.

Meanwhile, tungsten oxyfluoride or sulfur (S) may be used in the present invention as a deposition material contributing to smoothing.

According to the present invention, it is possible to produce a refractory metal plug having a low electrical resistance, a high reliability and an excellent bonding properties with respect to the upper metallization, while minimizing generation of residues.

DETAILED DESCRIPTION OF THE INVENTION

Figure 1:
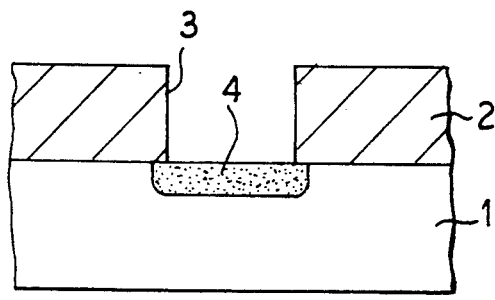
FIG. 1 is a schematic cross-sectional view showing the state is which a contact hole is just formed in a typical process of forming a W plug in accordance with the present invention.

The present invention will be explained with reference to non-limiting Examples shown in the drawings.

EXAMPLE 1

In the present Example, a W layer is formed to a thin thickness in a contact hole by a selective CVD method and subsequently smoothed. The present Example will be explained by referring to FIGS. 1 to 5.

FIG. 1 shows a sample wafer in which an impurity diffusion layer 4 is formed at a predetermined region of a silicon substrate 1 and in which an interlayer insulating film 2 is formed on the silicon substrate. Meanwhile, in the above sample wafer, the diffusion layer 4 may be replaced by a lower metallization which is coated with the interlayer insulating film 2. The interlayer insulating film 2 is formed of a silicon oxide film, such as BPSG. The contact hole 3 is formed in the interlayer insulating film 2 by the customary photolithographic technique and the etching technique. The surface of the diffusion layer 4 is exposed on the bottom of the contact hole 3.

The sample wafer is then set on a CVD device and pre-treated, if need be, for removing a native oxide film present on the bottom of the contact hole 3, under exemplary conditions of an $NF_3$ flow rate of 10 SCCM, an $H_2$ flow rate of 10 SCCM, a gas pressure of 6.7 Pa (=0.05 Torr) and an RF power of 0.5 W/cm².

After the end of the pre-treatment, a W layer 5 is selectively grown in the contact hole 3 by the selective CVD method based on a silane ($SiH_4$) reduction method under exemplary conditions of a $WF_6$ flow rate of 10 SCCM, an $SiH_4$ flow rate of 7 SCCM, an $H_2$ flow rate of 1000 SCCM, a wafer temperature of 260° C. and a gas pressure of 26.6 Pa (=0.2 Torr). By this selective growth, the thin W layer 5 is formed in the contact hole 3. However, at this stage, the W layer 5 had a surface 5a presenting a rough surface morphology.

Figure 3:
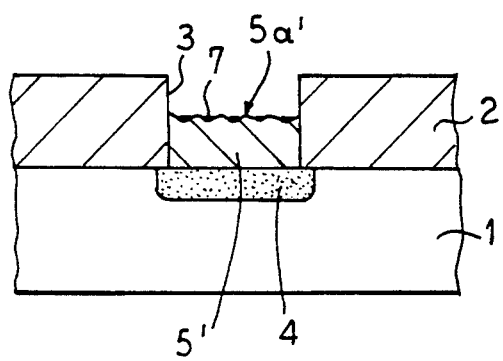
FIG. 3 is a schematic cross-sectional view showing the state in which the surface of the W layer is in the course of being smoothed by utilization of deposits.

The surface 5a of the W layer 5 was then smoothed, using an $SF_6/O_2$ mixed gas. For this smoothing, the sample wafer was cooled to a lower temperature. With the use of this mixed gas, deposits 7 such as tungsten oxyfluoride were preferentially formed in recesses on the surface 5a, while the lands on the surface 5a were preferentially etched by fluorine radicals F*. Thus the surface 5a was gradually smoothed to an improved surface morphology. FIG. 3 shows the state in which such smoothing is proceeding to form a smoothed surface 5a'.

Figure 4:
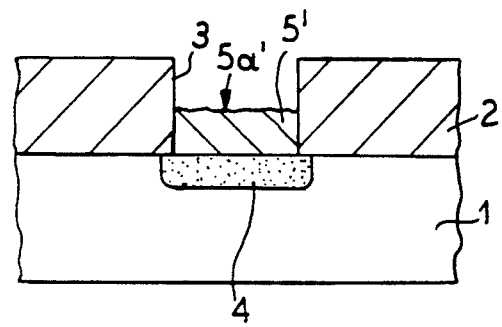
FIG. 4 is a schematic cross-sectional view showing the state in which the surface of the W layer is substantially smoothed and the deposits are just removed.
Figure 2:
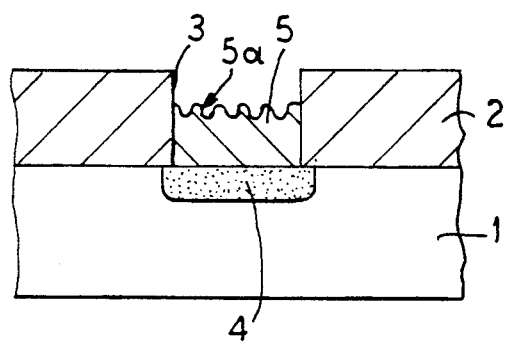
FIG. 2 is a schematic cross-sectional view showing the state in which a thin W layer is just formed within the contact hole by a selective CVD method.
Figure 5:
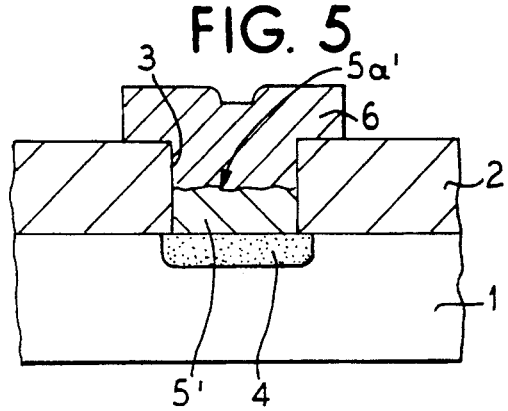
FIG. 5 is a schematic cross-sectional view showing the state in which an upper metallization is just formed contiguous to the W layer.

The sample wafer in its entirety was then heated for vaporizing the deposits 7 off from the surface 5a' of the tungsten layer 5', as shown in FIG. 4. In this manner, the surface 5a' of the W layer 5' was substantially smoothed. A layer of an Al-based material was then deposited by sputtering, as shown in FIG. 5, and patterned to form an Al-based metallization 6. Since the contact hole has its aspect ratio reduced by the preceding deposition of the W layer 5', excellent step coverage of the layer of the Al-based material could be achieved by such sputtering. Since the Al-based metallization 6 is electrically connected to the diffusion layer 4 by means of the smoothed W layer 5', the interconnection thus formed had a low resistance and high reliability.

Meanwhile, the $SF_6/O_2$ mixed gas employed in the present Example for smoothing may also be replaced by other gas systems, such as $S_2F_2$, $CF_4/O_2$ or $NF_3/O_2$. Besides, the Al-based metallization 6 used as an upper metallization may also be replaced by other refractory metal layers or its silicide layer.

EXAMPLE 2

In the present Example, a Blk-W layer, deposited by the Blk-CDV method, was smoothed. The present Example is hereinafter explained by referring to FIGS. 6 to 10.

Figure 6:
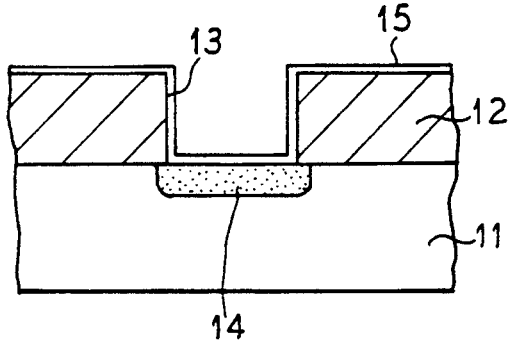
FIG. 6 is a schematic cross-sectional view showing the state in which a contact hole is coated and a titanium nitride is just formed in another typical process of forming a W plug in accordance with the present invention.

FIG. 6 shows a sample wafer in which, on a silicon substrate 11, on which a diffusion layer 14 is previously formed, an interlayer insulating film 12 of BPSG, for example, is formed, and a contact hole 13 is opened in the interlayer insulating film 12 as far as the diffusion layer 14. A thin titanium nitride layer 15 was formed on the entire upper surface of the interlayer insulating film 12 and on the entire inner wall surface of the contact hole 13 for functioning as a barrier layer against the diffusion layer 14 and for simultaneously assuring intimate bonding to a Blk-W layer 16 (FIG. 7) to be formed in a subsequent step and to the interlayer insulating film 12.

Figure 7:
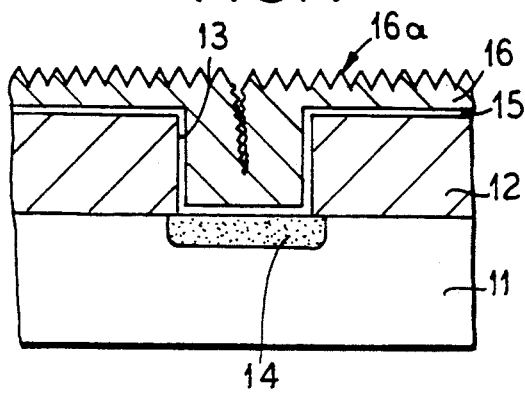
FIG. 7 is a schematic cross-sectional view showing the state in which a Blk-W layer is just deposited on the entire wafer surface by the Blk-CVD method.

The Blk-W layer 16 was then deposited by the Blk-CVD method, for completely coating the inside of the contact hole 13 and the interlayer insulating film 12, as shown in FIG. 7, by a two-step process consisting of a silane reduction method and a hydrogen reduction method. The conditions for the silane reduction method were so set that an $SiH_4$ flow rate was 15 SCCM, a $WF_6$ flow rate was 25 SCCM, a wafer temperature was 475° C. and a gas pressure was $1.06 \times 10^4$ Pa ($=80$ Torr). The conditions for the hydrogen reduction method were so set that an $H_2$ flow rate was 360 SCCM, a $WF_6$ flow rate was 60 SCCM, a wafer temperature was 475° C. and a gas pressure was $1.06 \times 10^4$ Pa ($=80$ Torr). Under these conditions, the Blk-W layer 16 filling the inside of the contact hole 13 and coating the interlayer insulating film 12 was produced. At this stage, the Blk-W layer 16 presented microirregularities and a rough surface morphology as shown by rough surfaces 16a.

Figure 8:
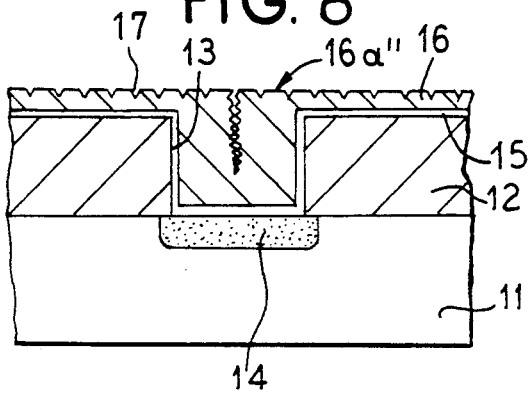
FIG. 8 is a schematic cross-sectional view showing the state in which the surface of the Blk-W layer is in the course of being smoothed by utilization of deposits.

The Blk-W layer 16 was then smoothed by a magnetically-enhanced microwave plasma etcher under illustrative conditions of an $S_2F_2$ flow rate of 5 SCCM, a gas pressure of 1.3 Pa ($=10$ mTorr), a wafer temperature of $-70°$ C. and a microwave power of 850 W (2 MHz). Since the wafer temperature during this smoothing operation was low, sulfur dissociated from $S_2F_2$ by ECR discharge was precipitated on a surface 16a of the Blk-W layer 16 as deposits 17. Such precipitation occurred preferentially in the recesses on the surface 16a and occurred to a lesser extent on the lands. Thus the lands were etched by F* so that ultimately the irregularities were smoothed. FIG. 8 shows the state in the course of such smoothing to form an intermediate smooth surface 16a.

Figure 9:
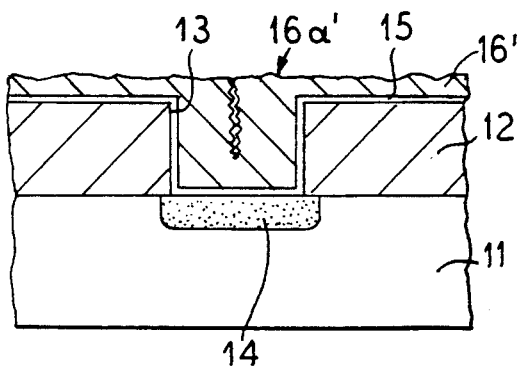
FIG. 9 is a schematic cross-sectional view showing the state in which the deposits are just removed from the surface of the Blk-W layer.

As the wafer was heated to about 150° C. after the end of the smoothing, the sulfur deposits 17 precipitated in the recesses of the surface 16a'' of the Blk-W layer 16 were sublimed off so that the surface 16a'' of the Blk-W layer 16', which was now substantially smoothed, was exposed as shown in FIG. 9.

After the deposits 17 were removed, the Blk-W layer 16 was etched back under exemplary conditions of an $SF_6$ flow rate of 30 SCCM, a $Cl_2$ flow rate of 20 SCCM, a gas pressure of 2 Pa ($=0.015$ Torr) and an RF power density of 0.25 W/cm$^2$. The etchback operation was terminated at a time point when the surface of the titanium nitride layer 15 was exposed. Residues were produced in only small quantities because the microirregularities on the surface 16a' of the Blk-W layer 16' were diminished.

Figure 10:
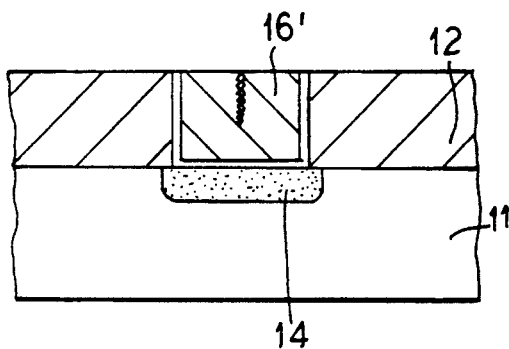
FIG. 10 is a schematic cross-sectional view showing the state in which the Blk-W layer and the titanium nitride layer are just etched back.

The titanium nitride layer 15 was further etched back until the surface of the interlayer insulating layer 12 was exposed as shown in FIG. 10. The plug could be formed in this manner with good reproducibility.

The $S_2F_2$ gas, employed in the present Example for smoothing, may also be replaced by other gases such that produces free sulfur in plasma.

EXAMPLE 3

In the present Example, a W layer was deposited to a thin thickness in a contact hole by the selective CVD method and smoothed and a Blk-W layer was subsequently formed. The present Example is hereinafter explained by referring to FIGS. 11 to 15.

Figure 11:
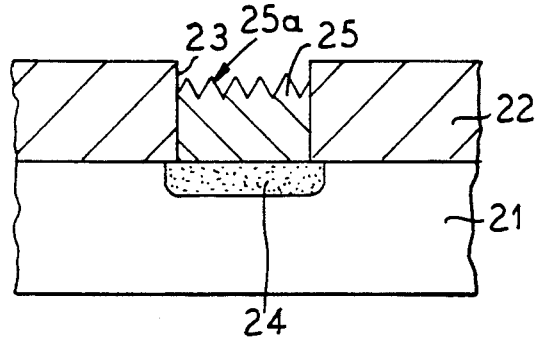
FIG. 11 is a schematic cross-sectional view showing the state in which a thin W layer is just formed within the contact hole by a selective CVD method in still another typical process of forming a W plug in accordance with the present invention.

FIG. 11 shows a sample wafer in which, on a silicon substrate 21, on which an impurity diffusion layer 24 was previously formed, an interlayer insulating film 22 of, for example, BPSG, was formed, and a contact hole 23 extended as far as the impurity diffusion layer 24 was formed in the interlayer insulating film 22.

The sample wafer was then set on a selective CVD apparatus and was pre-treated, if need be, for removing the native oxide film. A W layer 25 was formed to a small thickness within the contact hole 23 by the selective CVD method based on the silane reduction method. The conditions for this selective CVD method were so set that a $WF_6$ flow rate was 10 SCCM, an $SiH_4$ flow rate was 7 SCCM, an $H_2$ flow rate was 1000 SCCM, a wafer temperature was 260° C. and a gas pressure was 26.6 Pa ($=0.2$ Torr). The W layer 25 presented a surface 25a exhibiting rough surface morphology.

Figure 12:
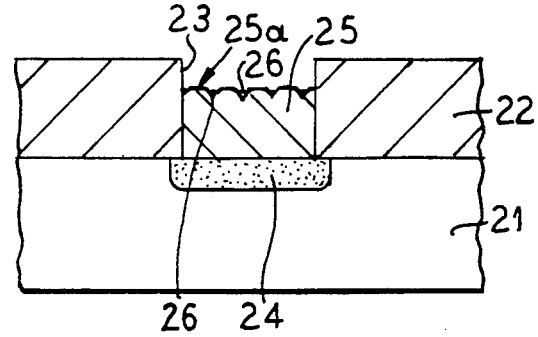
FIG. 12 is a schematic cross-sectional view showing the state in which the surface of the W layer is in the course of being smoothed by utilization of deposits.

The W layer 25 was then smoothed, using an $SF_6/O_2$ mixed gas, similarly to the preceding Example 1. Instead, a $CF_4/O_2$ may be used for smoothing. During this operation, smoothing proceeded by a mechanism explained in connection with Example 1. FIG. 12 shows the state in the course of such smoothing.

Figure 13:
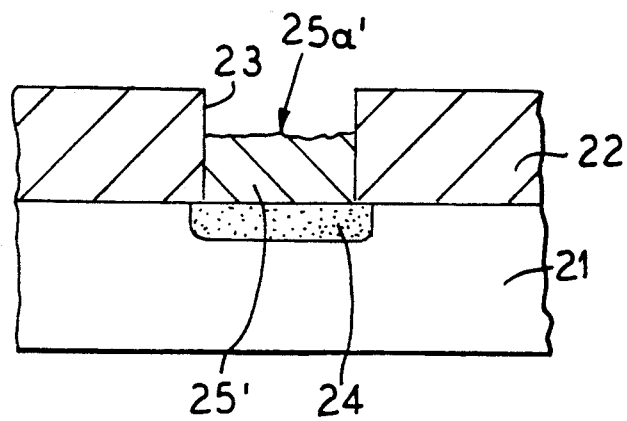
FIG. 13 is a schematic cross-sectional view showing the state in which the deposits are just removed from the surface of the W layer.

The sample wafer was then heated for vaporizing or removing the deposits 26 from the smooth surface 25a. In this manner, the W layer 25' having the substantially smooth surface 25a' was exposed as shown in FIG. 13.

Figure 14:
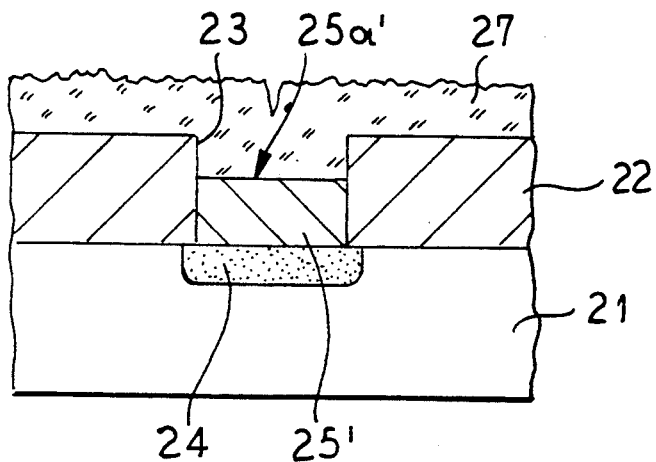
FIG. 14 is a schematic cross-sectional view showing the state in which a Blk-W layer is just stacked on the W layer by the Blk-CVD method.

Then, as shown in FIG. 14, a Blk-W layer 27 was formed by the Blk-CVD method for coating the entire wafer surface. Since the surface 25a' of the W layer 25' within the contact hole 23 was already smoothed, the Blk-W layer 27 deposited on the surface 25a' was not worsened further in surface morphology.

Figure 15:
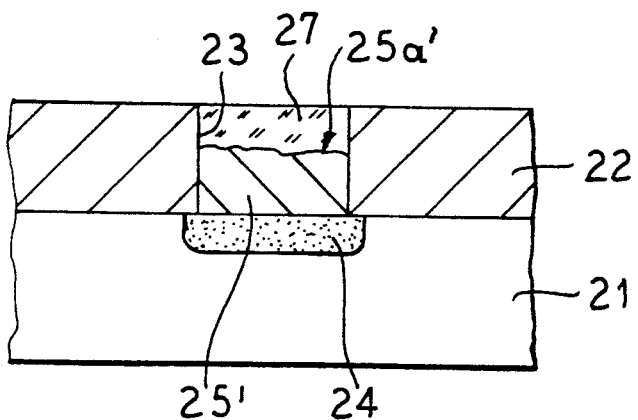
FIG. 15 is a schematic cross-sectional view showing the state in which the Blk-W layer is just etched back.

Then, as shown in FIG. 15, the Blk-W layer 27 was etched back so that the layer 27 was left only in the contact hole 23. With the Blk-W layer 27 etched back in this manner, a W plug formed of the W layer 25 and the Blk-W layer 27 was produced. The plug produced in this manner had a low electrical resistance and high reliability.

Meanwhile, in the present Example, since the contact hole 23 is ultimately filled with the Blk-W layer 27 to produce a planar upper surface, contact holes with different depths may be filled to different depths by the W layer formed by the selective CVD method without any inconvenience.

Although the Blk-W layer 27 was etched back without smoothing, it is more desirable to perform such smoothing of the surface of the Blk-W layer 27 before etching back the Blk-W layer 27.

The present invention is not limited to the above three Examples which are given only for the sake of illustration.

For example, although the W layer was used as the refractory metal layer in the above Examples, the refractory metal layer may also be Ti, Mo or Ta layers. Besides, the conditions for the selective CVD, Blk-CVD, smoothing or etchback operations may naturally be modified within the scope of the present invention.

What is claimed is:

1. A method for forming a refractory metal plug by filling a connecting hole formed in an interlayer insulating film with a layer of the refractory metal, comprising
    depositing the layer of the refractory metal in said connecting hole by a selective CVD method to an intermediate depth in the hole by the selective CVD method,
    smoothing the surface of said layer to form a smooth layer of the refractory metal, and then
    stacking a metallization layer on the smooth layer of the refractory metal.

2. A method as claimed in claim 1 wherein said smoothing is effected by depositing an oxyfluoride of the refractory metal or sulfur on the surface of the layer of the refractory metal.

3. A method as claimed in claim 2 wherein said refractory metal is selected from the group consisting of titanium, molybdenum, tantalum and tungsten.

4. A method according to claim 1, wherein said refractory metal is selected from the group consisting of titanium, molybdenum, tantalum and tungsten.

5. A method for forming a refractory metal plug by filling a connecting hole formed in an interlayer insulating film with a layer of the refractory metal, comprising
    forming the layer of the refractory metal in said connecting hole and on said interlayer insulating film by a blanket CVD method,
    smoothing the surface of the layer to form a smooth layer of the refractory metal by depositing an oxyfluoride of the refractory metal or sulfur on the surface of the layer of the refractory metal, and then
    etching back the smooth layer of the refractory metal.

6. A method as claimed in claim 5 wherein said refractory metal is selected from the group consisting of titanium, molybdenum, tantalum and tungsten.

7. A method for forming a refractory metal plug by filling a connecting hole formed in an interlayer insulating film with a layer of the refractory metal, comprising
    depositing a first layer of the refractory metal in said connecting hole by a selective CVD method to an intermediate depth in the hole by the selective CVD method,
    smoothing the surface of said first layer of the refractory metal,
    stacking a layer of a second refractory metal on said interlayer insulating film and on the smoothed first layer of the refractory metal by a blanket CVD method, and
    etching back said second layer of the refractory metal.

8. A method as claimed in claim 7 wherein said smoothing is effected by depositing an oxyfluoride of the refractory metal or sulfur on the surface of the layer of the refractory metal.

9. A method as claimed in claim 8 wherein said refractory metal is selected from the group consisting of titanium, molybdenum, tantalum and tungsten.

10. A method according to claim 7, wherein said refractory metal is selected from the group consisting of titanium, molybdenum, tantalum and tungsten.

* * * * *